(12) United States Patent
Abney et al.

(10) Patent No.: US 7,762,114 B2
(45) Date of Patent: Jul. 27, 2010

(54) FLOW-FORMED CHAMBER COMPONENT HAVING A TEXTURED SURFACE

(75) Inventors: Stephen Abney, San Martin, CA (US); Anthony Vesci, San Jose, CA (US); Joseph F. Sommers, San Jose, CA (US); Marc O'Donnell Schweitzer, San Jose, CA (US); Scott Dickerson, Lakewood, CO (US); Jennifer Watia Tiller, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 903 days.

(21) Appl. No.: 11/234,012

(22) Filed: Sep. 9, 2005

(65) Prior Publication Data
US 2007/0059460 A1 Mar. 15, 2007

(51) Int. Cl.
*B21D 22/16* (2006.01)
*B21D 17/02* (2006.01)

(52) U.S. Cl. .............................. 72/84; 72/85; 72/370.01

(58) Field of Classification Search ............... 72/82–85, 72/118, 102, 105, 106, 370.01, 370.04, 370.1, 72/208
See application file for complete search history.

(56) References Cited

U.S. PATENT DOCUMENTS

| 417,226 | A | * | 12/1889 | Browning ....................... 72/85 |
| 2,705,500 | A | | 4/1955 | Deer |
| 3,117,883 | A | | 1/1964 | Pierett |
| 3,457,151 | A | | 7/1969 | Kortejarvi |
| 3,482,082 | A | | 12/1969 | Israeli |
| 3,522,083 | A | | 7/1970 | Woolman |
| 3,565,771 | A | | 2/1971 | Gulla |
| 3,679,460 | A | | 7/1972 | Reid |
| 3,788,114 | A | * | 1/1974 | Marcovitch, Jacob .......... 72/83 |
| 4,175,416 | A | * | 11/1979 | Fukushima et al. ........... 72/254 |
| RE31,198 | E | | 4/1983 | Binns |

(Continued)

FOREIGN PATENT DOCUMENTS

DE 19719133 11/1998

(Continued)

OTHER PUBLICATIONS

European Patent Office, International Preliminary Report on Patentability/Written Opinion of the ISA, in PCT Appl. No. PCT/US2008/005183, Nov. 5, 2009, Munich (DE).

(Continued)

*Primary Examiner*—Dana Ross
*Assistant Examiner*—Debra M Sullivan
(74) *Attorney, Agent, or Firm*—Janah & Associates, P.C.

(57) ABSTRACT

A method of fabricating a component for a substrate processing chamber involves providing a preform having internal and external surfaces, and providing a mandrel having a textured surface with a pattern of textured features comprising protrusions and depressions. The internal surface of the preform component is contacted with the textured surface of mandrel, and a pressure is applied to the external surface of the preform. The pressure is sufficiently high to plastically deform the preform over the textured surface of the mandrel to form a component having a textured internal surface comprising the pattern of textured feature that are shaped and sized to adhere process residues generated in the processing of substrates.

21 Claims, 3 Drawing Sheets

U.S. PATENT DOCUMENTS

| | | | |
|---|---|---|---|
| 4,412,133 A | 10/1983 | Eckes et al. | |
| 4,419,201 A | 12/1983 | Levinstein et al. | |
| 4,480,284 A | 10/1984 | Tojo et al. | |
| 4,491,496 A | 1/1985 | Laporte et al. | |
| 4,606,802 A | 8/1986 | Kobayashi et al. | |
| 4,645,218 A | 2/1987 | Ooshio et al. | |
| 4,665,463 A | 5/1987 | Ward et al. | |
| 4,673,554 A | 6/1987 | Niwa et al. | |
| 4,713,119 A | 12/1987 | Earhart et al. | |
| 4,717,462 A | 1/1988 | Homma et al. | |
| 4,722,209 A * | 2/1988 | Mankins ........................ | 72/38 |
| 4,732,792 A | 3/1988 | Fujiyama | |
| 4,756,322 A | 7/1988 | Lami | |
| 4,832,781 A | 5/1989 | Mears | |
| 4,872,250 A | 10/1989 | De Marco | |
| 4,913,784 A | 4/1990 | Bogenschutz et al. | |
| 4,959,105 A | 9/1990 | Neidiffer et al. | |
| 4,995,958 A | 2/1991 | Anderson et al. | |
| 4,996,859 A | 3/1991 | Rose et al. | |
| 5,009,966 A | 4/1991 | Garg et al. | |
| 5,032,469 A | 7/1991 | Merz et al. | |
| 5,055,964 A | 10/1991 | Logan et al. | |
| 5,064,511 A | 11/1991 | Gobbetti et al. | |
| 5,104,501 A | 4/1992 | Okabayashi | |
| 5,104,834 A | 4/1992 | Watanabe et al. | |
| 5,117,121 A | 5/1992 | Watanabe et al. | |
| 5,151,845 A | 9/1992 | Watanabe et al. | |
| 5,164,016 A | 11/1992 | Henriet et al. | |
| 5,166,856 A | 11/1992 | Liporace et al. | |
| 5,180,322 A | 1/1993 | Yamamoto et al. | |
| 5,180,563 A | 1/1993 | Lai et al. | |
| 5,191,506 A | 3/1993 | Logan et al. | |
| 5,202,008 A | 4/1993 | Talieh | |
| 5,215,624 A | 6/1993 | Dastolfo et al. | |
| 5,215,639 A | 6/1993 | Boys | |
| 5,248,386 A | 9/1993 | Dastolfo et al. | |
| 5,258,047 A | 11/1993 | Tokisue et al. | |
| 5,270,266 A | 12/1993 | Hirano et al. | |
| 5,275,683 A | 1/1994 | Arami et al. | |
| 5,280,156 A | 1/1994 | Niori et al. | |
| 5,314,597 A | 5/1994 | Harra | |
| 5,315,473 A | 5/1994 | Collins et al. | |
| 5,324,053 A | 6/1994 | Kubota et al. | |
| 5,325,261 A | 6/1994 | Horwitz | |
| 5,338,367 A | 8/1994 | Henriet et al. | |
| 5,350,479 A | 9/1994 | Collins et al. | |
| 5,356,723 A | 10/1994 | Kimoto et al. | |
| 5,366,585 A | 11/1994 | Robertson et al. | |
| 5,382,469 A | 1/1995 | Kubota et al. | |
| 5,391,275 A | 2/1995 | Mintz | |
| 5,401,319 A | 3/1995 | Banholzer et al. | |
| 5,407,551 A | 4/1995 | Sieck et al. | |
| 5,409,590 A | 4/1995 | Hurwitt et al. | |
| 5,429,711 A | 7/1995 | Watanabe et al. | |
| 5,433,835 A | 7/1995 | Demaray et al. | |
| 5,458,759 A | 10/1995 | Hosokawa et al. | |
| 5,460,694 A | 10/1995 | Schapira et al. | |
| 5,463,526 A | 10/1995 | Mundt | |
| 5,474,649 A | 12/1995 | Kava et al. | |
| 5,487,822 A | 1/1996 | Demaray et al. | |
| 5,490,913 A | 2/1996 | Schertler et al. | |
| 5,509,558 A | 4/1996 | Imai et al. | |
| 5,512,078 A | 4/1996 | Griffin | |
| 5,520,740 A | 5/1996 | Kanai et al. | |
| 5,531,835 A | 7/1996 | Fodor et al. | |
| 5,542,559 A | 8/1996 | Kawakami et al. | |
| 5,549,802 A | 8/1996 | Guo | |
| 5,587,039 A | 12/1996 | Salimian et al. | |
| 5,614,071 A | 3/1997 | Mahvan et al. | |
| 5,622,070 A * | 4/1997 | Bulso, Jr. ........................ | 72/68 |
| 5,643,422 A | 7/1997 | Yamada | |
| 5,660,640 A | 8/1997 | Laube | |
| 5,671,835 A | 9/1997 | Tanaka et al. | |
| 5,684,669 A | 11/1997 | Collins et al. | |
| 5,685,914 A | 11/1997 | Hills et al. | |
| 5,685,959 A | 11/1997 | Bourez et al. | |
| 5,695,825 A | 12/1997 | Scruggs | |
| 5,700,179 A | 12/1997 | Hasegawa et al. | |
| 5,714,010 A | 2/1998 | Matsuyama et al. | |
| 5,720,818 A | 2/1998 | Donde et al. | |
| 5,736,021 A | 4/1998 | Ding et al. | |
| 5,745,331 A | 4/1998 | Shamouilian et al. | |
| 5,755,887 A | 5/1998 | Sano et al. | |
| 5,762,748 A | 6/1998 | Banholzer et al. | |
| 5,792,562 A | 8/1998 | Collins et al. | |
| 5,808,270 A | 9/1998 | Marantz et al. | |
| 5,812,362 A | 9/1998 | Ravi | |
| 5,821,166 A | 10/1998 | Hajime et al. | |
| 5,824,197 A | 10/1998 | Tanaka | |
| 5,830,327 A | 11/1998 | Kolnekow | |
| 5,840,434 A | 11/1998 | Kojima et al. | |
| 5,858,100 A | 1/1999 | Maeda et al. | |
| 5,876,573 A | 3/1999 | Moslehi et al. | |
| 5,879,523 A | 3/1999 | Wang et al. | |
| 5,879,524 A | 3/1999 | Hurwitt et al. | |
| 5,885,428 A | 3/1999 | Kogan | |
| 5,886,863 A | 3/1999 | Nagasaki et al. | |
| 5,903,428 A | 5/1999 | Grimard et al. | |
| 5,910,338 A | 6/1999 | Donde et al. | |
| 5,916,378 A | 6/1999 | Bailey et al. | |
| 5,916,454 A | 6/1999 | Richardson et al. | |
| 5,920,764 A | 7/1999 | Hanson | |
| 5,930,661 A | 7/1999 | Lu | |
| 5,939,146 A | 8/1999 | Lavernia | |
| 5,942,041 A | 8/1999 | Lo et al. | |
| 5,942,445 A | 8/1999 | Kato et al. | |
| 5,948,288 A | 9/1999 | Treves et al. | |
| 5,951,374 A | 9/1999 | Kato et al. | |
| 5,953,827 A | 9/1999 | Or et al. | |
| 5,963,778 A | 10/1999 | Stellrecht | |
| 5,967,047 A | 10/1999 | Kuhn et al. | |
| 5,976,327 A | 11/1999 | Tanaka | |
| 6,010,583 A | 1/2000 | Annavarapu et al. | |
| 6,015,465 A | 1/2000 | Kholodenko et al. | |
| 6,026,666 A | 2/2000 | Zimmermann et al. | |
| 6,027,604 A | 2/2000 | Lim et al. | |
| 6,051,114 A | 4/2000 | Yao et al. | |
| 6,051,122 A | 4/2000 | Flanigan | |
| 6,059,945 A | 5/2000 | Fu et al. | |
| 6,071,389 A | 6/2000 | Zhang | |
| 6,073,830 A | 6/2000 | Hunt et al. | |
| 6,086,735 A | 7/2000 | Gilman et al. | |
| 6,108,189 A | 8/2000 | Weldon et al. | |
| 6,120,621 A | 9/2000 | Jin et al. | |
| 6,120,640 A | 9/2000 | Shih et al. | |
| 6,143,432 A | 11/2000 | de Rochemont et al. | |
| 6,146,509 A | 11/2000 | Aragon | |
| 6,149,784 A | 11/2000 | Su et al. | |
| 6,150,762 A | 11/2000 | Kim et al. | |
| 6,152,071 A | 11/2000 | Akiyama et al. | |
| 6,159,299 A | 12/2000 | Koai et al. | |
| 6,162,297 A | 12/2000 | Mintz et al. | |
| 6,162,336 A | 12/2000 | Lee | |
| 6,170,429 B1 | 1/2001 | Schoepp et al. | |
| 6,183,614 B1 | 2/2001 | Fu | |
| 6,183,686 B1 | 2/2001 | Bardus et al. | |
| 6,190,516 B1 | 2/2001 | Xiong et al. | |
| 6,198,067 B1 | 3/2001 | Ikeda et al. | |
| 6,199,259 B1 | 3/2001 | Demaray et al. | |
| 6,221,217 B1 | 4/2001 | Moslehi et al. | |
| 6,227,435 B1 | 5/2001 | Lazarz et al. | |
| 6,235,163 B1 | 5/2001 | Angelo et al. | |
| 6,238,528 B1 | 5/2001 | Xu et al. | |
| 6,248,667 B1 | 6/2001 | Kim et al. | |

| | | |
|---|---|---|
| 6,250,251 B1 | 6/2001 | Akiyama et al. |
| 6,269,670 B2 | 8/2001 | Koestermeier |
| 6,274,008 B1 | 8/2001 | Gopalraja et al. |
| 6,276,997 B1 | 8/2001 | Li |
| 6,280,584 B1 | 8/2001 | Kumar et al. |
| 6,284,093 B1 | 9/2001 | Ke et al. |
| 6,287,437 B1 | 9/2001 | Pandhumsoporn et al. |
| 6,299,740 B1 | 10/2001 | Hieronymi et al. |
| 6,306,489 B1 | 10/2001 | Hellmann et al. |
| 6,306,498 B1 | 10/2001 | Yuuki et al. |
| 6,338,781 B1 | 1/2002 | Sichmann et al. |
| 6,338,906 B1 | 1/2002 | Ritland et al. |
| 6,340,415 B1 | 1/2002 | Raaijmakers et al. |
| 6,344,114 B1 | 2/2002 | Sichmann et al. |
| 6,364,957 B1 | 4/2002 | Schneider et al. |
| 6,365,010 B1 | 4/2002 | Hollars |
| 6,372,609 B1 | 4/2002 | Aga |
| 6,379,575 B1 | 4/2002 | Yin et al. |
| 6,383,459 B1 | 5/2002 | Singh et al. |
| 6,387,809 B2 | 5/2002 | Toyama |
| 6,394,023 B1 | 5/2002 | Crocker |
| 6,401,652 B1 | 6/2002 | Mohn et al. |
| 6,416,634 B1 | 7/2002 | Mostovoy et al. |
| 6,423,175 B1 | 7/2002 | Huang et al. |
| 6,444,083 B1 | 9/2002 | Steger et al. |
| 6,447,853 B1 | 9/2002 | Suzuki et al. |
| 6,454,870 B1 | 9/2002 | Brooks |
| 6,475,336 B1 | 11/2002 | Hubacek |
| 6,484,794 B1 | 11/2002 | Schulak et al. |
| 6,500,321 B1 | 12/2002 | Ashtiani et al. |
| 6,506,312 B1 | 1/2003 | Bottomfield |
| 6,545,267 B1 | 4/2003 | Miura et al. |
| 6,555,471 B2 | 4/2003 | Sandhu et al. |
| 6,558,505 B2 | 5/2003 | Suzuki et al. |
| 6,565,984 B1 | 5/2003 | Wu et al. |
| 6,566,161 B1 | 5/2003 | Rosenberg et al. |
| 6,576,909 B2 | 6/2003 | Donaldson et al. |
| 6,579,431 B1 | 6/2003 | Bolcavage et al. |
| 6,599,405 B2 | 7/2003 | Hunt et al. |
| 6,619,537 B1 | 9/2003 | Zhang et al. |
| 6,620,736 B2 | 9/2003 | Drewery |
| 6,623,595 B1 | 9/2003 | Han et al. |
| 6,623,597 B1 | 9/2003 | Han et al. |
| 6,623,610 B1 | 9/2003 | Onishi |
| 6,627,050 B2 | 9/2003 | Miller et al. |
| H2087 H | 11/2003 | Balliett et al. |
| 6,645,357 B2 | 11/2003 | Powell |
| 6,652,668 B1 | 11/2003 | Perry et al. |
| 6,652,716 B2 | 11/2003 | Kao et al. |
| 6,660,135 B2 | 12/2003 | Yu et al. |
| 6,676,812 B2 | 1/2004 | Chung |
| 6,708,870 B2 | 3/2004 | Koenigsmann et al. |
| 6,743,340 B2 | 6/2004 | Fu |
| 6,749,103 B1 | 6/2004 | Ivanov et al. |
| 6,776,879 B2 | 8/2004 | Yamamoto et al. |
| 6,777,045 B2 | 8/2004 | Lin et al. |
| 6,797,362 B2 | 9/2004 | Parfeniuk et al. |
| 6,797,639 B2 | 9/2004 | Carducci et al. |
| 6,812,471 B2 | 11/2004 | Popiolkowski et al. |
| 6,824,652 B2 | 11/2004 | Park |
| 6,840,427 B2 | 1/2005 | Ivanov |
| 6,858,116 B2 | 2/2005 | Okabe et al. |
| 6,872,284 B2 | 3/2005 | Ivanov et al. |
| 6,902,627 B2 | 6/2005 | Brueckner et al. |
| 6,902,628 B2 | 6/2005 | Wang et al. |
| 6,916,407 B2 | 7/2005 | Vosser et al. |
| 6,933,025 B2 | 8/2005 | Lin et al. |
| 6,933,508 B2 | 8/2005 | Popiolkowski et al. |
| 6,955,748 B2 | 10/2005 | Kim |
| 6,955,852 B2 | 10/2005 | Ivanov |
| 6,992,261 B2 | 1/2006 | Kachalov et al. |
| 7,026,009 B2 | 4/2006 | Lin et al. |
| 7,041,200 B2 | 5/2006 | Le et al. |
| 7,063,773 B2 | 6/2006 | Ivanov et al. |
| 7,121,938 B2 | 10/2006 | Suzuki |
| 7,131,883 B2 | 11/2006 | Park et al. |
| 7,146,703 B2 | 12/2006 | Ivanov |
| 7,264,679 B2 | 9/2007 | Schweitzer et al. |
| 7,504,008 B2 | 3/2009 | Doan et al. |
| 7,579,067 B2 | 8/2009 | Lin et al. |
| 7,618,769 B2 | 11/2009 | Brueckner et al. |
| 2001/0001367 A1 | 5/2001 | Koestermeier |
| 2001/0033706 A1 | 10/2001 | Shimomura et al. |
| 2001/0045353 A1 | 11/2001 | Hieronymi et al. |
| 2002/0029745 A1 | 3/2002 | Nagaiwa et al. |
| 2002/0033330 A1 | 3/2002 | Demaray et al. |
| 2002/0076490 A1 | 6/2002 | Chiang et al. |
| 2002/0086118 A1 | 7/2002 | Chang et al. |
| 2002/0090464 A1 | 7/2002 | Jiang et al. |
| 2002/0100680 A1 | 8/2002 | Yamamoto et al. |
| 2003/0019746 A1 | 1/2003 | Ford et al. |
| 2003/0026917 A1 | 2/2003 | Lin et al. |
| 2003/0047464 A1 | 3/2003 | Sun et al. |
| 2003/0108680 A1 | 6/2003 | Gell et al. |
| 2003/0116276 A1 | 6/2003 | Weldon et al. |
| 2003/0118731 A1 | 6/2003 | He et al. |
| 2003/0127319 A1 | 7/2003 | Demaray et al. |
| 2003/1364248 | 7/2003 | Krogh |
| 2003/0168168 A1 | 9/2003 | Liu et al. |
| 2003/0170486 A1 | 9/2003 | Austin et al. |
| 2003/0173526 A1 | 9/2003 | Popiolkowski et al. |
| 2003/0185935 A1 | 10/2003 | Maeda et al. |
| 2003/0185965 A1 | 10/2003 | Lin et al. |
| 2003/0218054 A1 | 11/2003 | Koenigsmann et al. |
| 2003/0221702 A1 | 12/2003 | Peebles |
| 2004/0045574 A1 | 3/2004 | Tan |
| 2004/0048876 A1 | 3/2004 | Busch et al. |
| 2004/0056070 A1 | 3/2004 | Ivanov |
| 2004/0056211 A1 | 3/2004 | Popiolkowski et al. |
| 2004/0079634 A1 | 4/2004 | Wickersham et al. |
| 2004/0099285 A1 | 5/2004 | Wang et al. |
| 2004/0113364 A1 | 6/2004 | Ivanov |
| 2004/0180158 A1 | 9/2004 | Lin et al. |
| 2004/0256226 A1 | 12/2004 | Wickersham |
| 2004/0261946 A1 | 12/2004 | Endoh et al. |
| 2005/0011749 A1 | 1/2005 | Kachalov et al. |
| 2005/0028838 A1 | 2/2005 | Brueckner |
| 2005/0048876 A1 | 3/2005 | West et al. |
| 2005/0061857 A1 | 3/2005 | Hunt et al. |
| 2005/0067469 A1 | 3/2005 | Facey et al. |
| 2005/0089699 A1 | 4/2005 | Lin et al. |
| 2005/0092604 A1 | 5/2005 | Ivanov |
| 2005/0098427 A1 | 5/2005 | Cho et al. |
| 2005/0147150 A1 | 7/2005 | Wickersham et al. |
| 2005/0161322 A1 | 7/2005 | Smathers |
| 2005/0178653 A1 | 8/2005 | Fisher |
| 2005/0211548 A1 | 9/2005 | Gung et al. |
| 2005/0238807 A1 | 10/2005 | Lin |
| 2005/0271984 A1 | 12/2005 | Brueckner et al. |
| 2005/0282358 A1 | 12/2005 | Di Cioccio et al. |
| 2005/0284372 A1 | 12/2005 | Murugesh et al. |
| 2006/0005767 A1 | 1/2006 | Tsai et al. |
| 2006/0070876 A1 | 4/2006 | Wu et al. |
| 2006/0090706 A1 | 5/2006 | Miller et al. |
| 2006/0105182 A1 | 5/2006 | Brueckner et al. |
| 2006/0108217 A1 | 5/2006 | Krempel-Hesse et al. |
| 2006/0188742 A1 | 8/2006 | West et al. |
| 2006/0204160 A1* | 9/2006 | Arena .................... 384/612 |
| 2006/0251822 A1 | 11/2006 | Gell et al. |
| 2006/0283703 A1 | 12/2006 | Lee et al. |
| 2007/0059460 A1 | 3/2007 | Abney et al. |
| 2007/0102286 A1 | 5/2007 | Scheible et al. |
| 2007/0113783 A1 | 5/2007 | Lee et al. |
| 2007/0125646 A1 | 6/2007 | Young et al. |
| 2007/0170052 A1 | 7/2007 | Ritchie et al. |
| 2007/0215463 A1 | 9/2007 | Parkhe et al. |

| | | | |
|---|---|---|---|
| 2007/0283884 | A1 | 12/2007 | Tiller et al. |
| 2008/0178801 | A1 | 7/2008 | Pavloff et al. |
| 2008/0257263 | A1 | 10/2008 | Pavloff et al. |

FOREIGN PATENT DOCUMENTS

| | | |
|---|---|---|
| EP | 0239349 | 9/1987 |
| EP | 0439000 | 7/1991 |
| EP | 0601788 | 6/1994 |
| EP | 0635869 | 1/1995 |
| EP | 0791956 | 8/1997 |
| EP | 0818803 A | 1/1998 |
| EP | 0838838 | 4/1998 |
| EP | 0838838 A2 | 4/1998 |
| EP | 0845545 | 6/1998 |
| EP | 1049133 A2 | 11/2000 |
| EP | 1094496 A | 4/2001 |
| EP | 1158072 A2 | 11/2001 |
| EP | 1258908 A2 | 11/2002 |
| FR | 2562097 | 10/1985 |
| GB | 1 424 365 A | 2/1976 |
| GB | 1424365 A | 2/1976 |
| JP | 54-162969 | 12/1979 |
| JP | 54162696 | 12/1979 |
| JP | 11-59368 | 12/1987 |
| JP | 63235435 | 9/1988 |
| JP | 02-027748 | 1/1990 |
| JP | 02-101157 | 4/1990 |
| JP | 03-138354 | 6/1991 |
| JP | 06-232243 | 8/1994 |
| JP | 07-197272 | 8/1995 |
| JP | 09-017850 | 1/1997 |
| JP | 09-272965 | 10/1997 |
| JP | 10-045461 | 2/1998 |
| JP | 63149396 | 6/1998 |
| JP | 10-251871 | 9/1998 |
| JP | 10-330971 | 12/1998 |
| JP | 11-137440 | 5/1999 |
| JP | 11-220164 | 8/1999 |
| JP | 11-283972 | 10/1999 |
| JP | 2000-228398 | 10/1999 |
| JP | 2250990 | 10/1999 |
| JP | 11-345780 | 12/1999 |
| JP | 2000-072529 | 3/2000 |
| JP | 2000-191370 | 7/2000 |
| JP | 2002-69695 | 3/2002 |
| TW | 546680 | 8/2003 |
| WO | WO-98/50599 | 11/1998 |
| WO | WO-99/17336 | 4/1999 |
| WO | WO-0184624 A2 | 11/2001 |
| WO | WO 0184624 A2 | 11/2001 |
| WO | WO-02/15255 | 2/2002 |
| WO | WO 02/093624 | 11/2002 |
| WO | WO-03/083160 | 10/2003 |
| WO | WO-2004/010494 A2 | 1/2004 |
| WO | WO 2005/071137 | 8/2005 |
| WO | WO-2007-030824 A3 | 3/2007 |
| WO | WO 2008/079722 | 7/2008 |

OTHER PUBLICATIONS

European Patent Office, PCT International Search Report for International Application No. PCT/US 02/20095.
Final Office Action in U.S. Appl. No. 10/981,261 dated Dec. 16, 2008.
Final Office Action in U.S. Appl. No. 10/981,261 dated Oct. 30, 2007.
Nakasuji, et al., "Low Voltage and High Speed Operating Electrostatic Wafer Chuck," J. Vac. Sci. Technol. A, 10(6):3573-3578 (Nov./Dec. 1992).
Non-Final Office Action from U.S. Appl. No. 10/981,261 dated Mar. 6, 2009.
Non-Final Office Action in U.S. Appl. No. 10/981,261 dated Jun. 4, 2008.
Non-Final Office Action in U.S. Appl. No. 10/981,261 dated May 17, 2007.
Non-Final Office Action in U.S. Appl. No. 11/738,788 dated Dec. 29, 2009.
Rosenberg, RW, "Increasing PVD Tool Uptime and Particle Control with Twin-Wire-Arc Spray Coatings", Mar. 2001, p. 103-105, 108, 11, vol. 19, No. 3, Cannon Comm., Santa Monic, CA.
Tucker, Jr., Robert C., "Plasma and Detonation Gun Deposition Techniques and Coating Properties," Union Carbide Corp., Coatings Service Dept., Indianapolis, IN, pp. 454-489.
U.S. Appl. No. 60/739,658, to Young et al., filed Nov. 25, 2005.
U.S. Appl. No. 60/788,378, to Ritchie et al., filed Mar. 30, 2006.
Watanabe, et al., "Effect of Additives on the Electrostatic Force of Alumina Electrostatic Chucks," J. of the Ceramic Soc. of Jpn., 100(1):1-6 (1992).
European Patent Office (EPO), PCT International Preliminary Report on Patentability/Written Opinion of the International Searching Authority in Appl. No. PCT/US2006/035376 entitled "Flow-formed chamber component having a textured surface", Mar. 11, 2008, Rijswijk (NL).
Sipo (P.R. China), Office Action dated Jul. 10, 2009 in CN Patent Appl. No. 200680033049.0 entitled "Flow-formed chamber component having a textured surface", Beijing (CN).

* cited by examiner

FLOW-FORMED CHAMBER COMPONENT HAVING A TEXTURED SURFACE

BACKGROUND

In the processing of substrates such as semiconductor wafers and displays, a substrate is placed in a process chamber and exposed to an energized gas to deposit or etch material on the substrate. During such processing, process residues are generated and can deposit on internal surfaces in the chamber. For example, in sputter deposition processes, material sputtered from a target for deposition on a substrate also deposits on other component surfaces in the chamber, such as on deposition rings, shadow rings, wall liners, and focus rings. In subsequent process cycles, the deposited process residues can "flake off" of the chamber surfaces to fall upon and contaminate the substrate. To reduce the contamination of the substrates by process residues, the surfaces of components in the chamber can be textured. Process residues adhere to the textured surface and inhibit the process residues from falling off and contaminating the substrates in the chamber.

Typically, textured surface components are fabricated in a multiple step process. In the first fabrication step, the shape or overall structure of the component is fabricated, for example, by CNC machining of a block of metal into the desired structure. Thereafter, a second fabrication process is used to form the textured surface of the machined component. For example, the surface texturing process can include grinding, bead blasting or polishing, or combinations thereof. In one version, the textured surface is formed by directing an electromagnetic energy beam onto a surface of a component to form depressions and protrusions to which process deposits adhere well. An example of such a surface is a Lavacoat™ surface, as described for example in commonly assigned U.S. Patent Publication No. 2003-0173526 to Popiolkowski et al, published on Sep. 18, 2003, and filed on Mar. 13, 2002; and U.S. Pat. No. 6,812,471 to Popiolkowski et al, issued on Nov. 2, 2004; both of which are incorporated herein by reference in their entireties. The Lavacoat™ surface comprises depressions and protrusions to which process residues can adhere to reduce the contamination of substrates during their processing.

However, conventional processes to fabricate textured components are often expensive because of the multiple fabrication steps needed to form the component and its textured surface. The fabrication costs inhibit widespread implementation of the textured components despite the processing benefits provided by the components. The expense of conventional fabrication processes is at least in part due to the complicated multi-step fabrication procedures used in these processes, as well as the expensive fabrication equipment. For example, component fabrication machinery, such as for example, electromagnetic energy beam generating equipment, is expensive and can substantially increase the fabrication costs of the textured components.

The component fabrication time and costs are a further problem when the cleaning processes used to refurbish textured components erodes the component after several cleaning cycles. A cleaning process is typically performed once residues have accumulated on the textured component to remove the residues and refurbish the component for re-use. For example, repeated cleaning of the textured component with solutions comprising $HNO_3$ or HF eventually erodes the textured surface of components, typically requiring the replacement of the eroded components with newly-fabricated components. Thus, the expense of fabricating the new textured surface components undesirably increases the costs associated with operating a chamber.

Accordingly, it is desirable to have a method of fabricating textured chamber components that is relatively inexpensive and efficient compared to conventional fabrication processes. It is further desirable to have a component with a textured surface to which process residues can adhere well.

SUMMARY

In one version, a method of fabricating a component for a substrate-processing chamber involves providing a preform having internal and external surfaces, and a mandrel having a textured surface with a pattern of textured features comprising periodic and alternating protrusions and depressions. The internal surface of the preform is contacted with the textured surface of mandrel. A pressure is applied to the preform that is sufficiently high to plastically deform the preform and cause the internal surface of the perform to flow over the textured surface of the mandrel to form a component having a textured internal surface comprising a pattern of textured features.

In another version, the textured surface of the mandrel has protuberances having a height of from about 0.005 to about 0.050 inches and a width at half height of from about 0.007 to about 0.070 inches, and depressions having a depth of from about 0.005 to about 0.050 inches, and a width at half depth of from about 0.002 to about 0.130 inches. The internal surface of the preform is contacted with the textured surface of the mandrel. Rotating rollers are pressed against the external surface of the perform to plastically deform the preform causing the internal surface of the preform to flow over the textured surface of the mandrel, thereby forming a component having a textured internal surface comprising a reverse pattern of alternating protuberances and depressions that is a mirror image of the pattern on the mandrel.

A component for a substrate processing chamber comprises an external surface formed by rotating rollers that are pressed against a perform and an internal surface formed by plastic deformation over a textured surface of a mandrel having a pattern of textured features comprising periodic and alternating protrusions and depressions so that the internal surface has a pattern of textured features that are correspondingly shaped and sized, whereby process residues generated in the processing of substrates adhere to the textured internal surface to reduce contamination of the substrates in substrate fabrication.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

A substrate-processing chamber comprises components for processing a substrate in an energized gas. One or more of the components comprises a surface that is textured, such that process deposits generated during the processing of substrates can adhere to the component surfaces to reduce the contamination of processed substrates from the process deposits. Process deposits that adhere to the textured surfaces of chamber components can include metal-containing deposits, such as deposits comprising at least one of tantalum, tantalum nitride, titanium, titanium nitride, aluminum, copper, tungsten, and tungsten nitride.

Figure 1A:
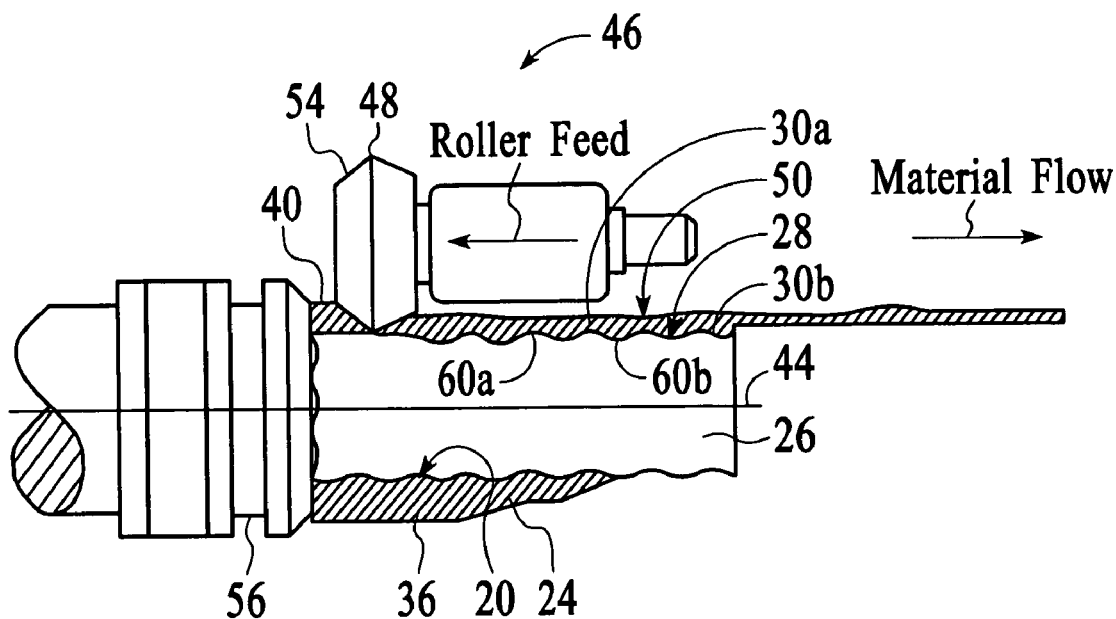
FIG. 1 is a partial sectional side view of an embodiment of an apparatus for performing a flow-forming process.
Figure 1B:
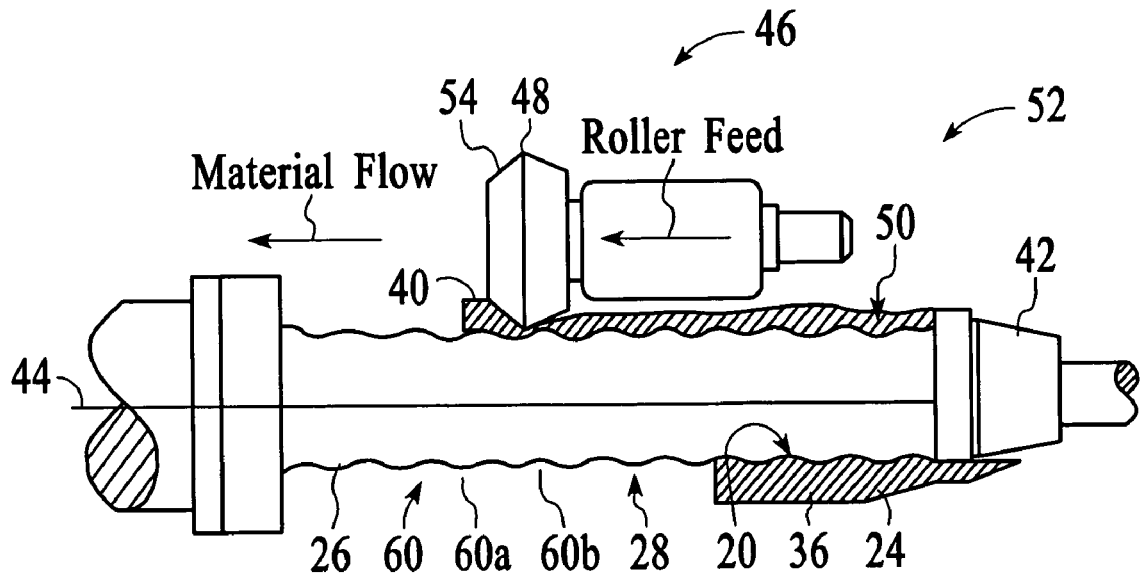

The textured surfaces 20 of selected chamber components 22 and the shape of the component itself is formed by a flow-forming apparatus and process adapted for the textured surface component as, for example, shown in FIG. 1. The flow-forming apparatus applies a pressure to a preform 24 to plastically deform and flow the material of the preform over a mandrel 26 to provide the desired bulk shape of the components 22. The mandrel 26 is desirably adapted to form a predetermined textured pattern on the surface 20 of the preform 24 that contacts the mandrel 26. For example, the mandrel 26 may comprise a textured surface 28. The plastic deformation of the component material under the applied pressure molds the surface 20 of the preform 24 to conform to the texture of the mandrel surface 28, thus transferring at least a portion of the mandrel surface pattern to the final chamber component 22. By providing a mandrel 26 that has been specially adapted to create the desired surface texture pattern 34, components 22 having not only the desired bulk shape but also the desired surface texture pattern 34 may be efficiently and repeatedly formed by the flow-forming process.

The preform 24 has a pre-selected size and shape that forms the desired final component 22. A suitable preform shape for a flow-forming process may be for example a conical, cylindrical, tube-like and other shape, which can be molded and contoured on the mandrel 26. Typically, the perform has an axis of circular symmetry that is aligned to the axis of symmetry of the mandrel 26. The walls 36 of the preform 24 are made sufficiently thick that a desired final thickness of the walls of the component 22 is obtained after the plastic deformation caused by the flow-forming process. For example, the thickness of the preform walls 36 is greater than the component wall thickness by a calculated amount, for example, at least 5%, to achieve the desired final thickness of the walls of the final component 22. The preform 24 is made from a metal with relatively high ductility that may be plastically deformed under pressure substantially without breaking or cracking of the metal. Suitable metals may comprise, for example, at least one of aluminum, copper, stainless steel, titanium, and associated alloys. The preform 24 may be formed by methods including deep drawings, stamping, CNC machining, and press-forming, as well as by other metal shape fabrication methods known to those of ordinary skill in the art.

In the flow-forming process, the preform 24 comprises an internal surface 20 that is fitted over at least a portion of the textured surface 28 of the mandrel 26, and may rest against the surface 28 of the mandrel 26. The mandrel 26 is a component of a flow-forming apparatus 52 comprising other parts adapted for the flow-forming of components 22. A first end 40 of the of the preform 24, which may be a closed or semi-closed end, can be held by a headstock 56 and/or tailstock 42 capable of exerting a hydraulic pressure to hold the preform 24 in place. The mandrel 26 is typically rotated about its longitudinal axis 44, for example by a motor (not shown) which in turn rotates the preform 24 in synchronization with the mandrel 26. A pressure applying device 46, such as for example pressure rollers 48, are applied against an external surface 50 of the preform 24 to plastically deform and flow the preform material in an axial direction along the surface 28 of the mandrel 26.

In the embodiment shown, the pressure rollers 48 move towards the first end 40 of the preform 24 to press and flow the preform material over the mandrel 26 in a direction away from the first end 40 of the perform 24. The preform material is desirably compressed and plasticized above its yield strength by the applied pressure to flow the material in an axial direction along the surface 28 of the mandrel 26. The pressure rollers 48 thus reduce the thickness of and lengthen the walls 36 of the preform 24 by flowing the preform material along the mandrel 26. The pressure applied to the external surface 50 is desirably sufficiently high to plastically deform and flow the preform material, substantially without breaking or cracking the material. The pressure applied varies as a function of the properties of the material being formed. The mandrel and the rollers are located at defined distances, which may be a constant or variable distance, to establish the relationship of the inner and outer surfaces of the finished part. In one version, the pressure rollers 48 may comprise circularly shaped rollers that are adapted to be rotated by a motor (not shown) in a direction parallel or anti-parallel to the direction of rotation of the mandrel 26, and thus exert a radial force on the external surface 50 of the preform 24. The pressure rollers 48 may also comprise an angled forward edge 54 that exerts an axial force on the external surface 50 of the preform 24 to drive the preform material in an axial direction across the surface 28 of the mandrel 26. In one version, a plurality of pressure rollers 48 are spaced apart about the circumference of the preform 24, and the pressure rollers 48 may also be axially and radially spaced apart, to exert pressures against a plurality of different regions of the preform external surface 50.

Figure 2:
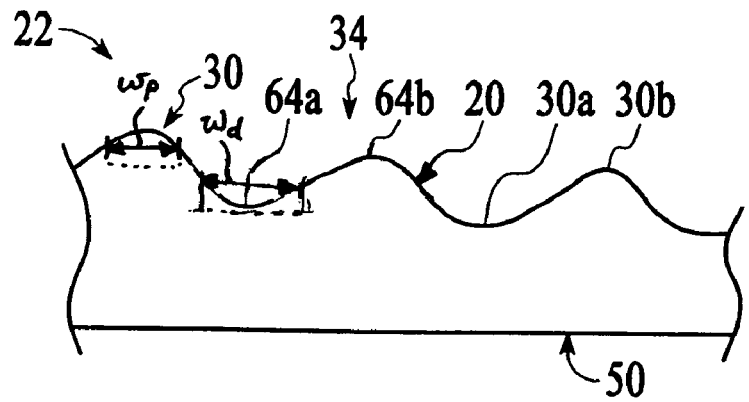
FIG. 2 is a partial sectional side view of a component having a textured internal surface formed by a flow-forming process.

The mandrel 26 provided for the flow-forming process is desirably adapted to provide the desired bulk shape and surface texture pattern 34 of the final flow-formed component 22. For example, the mandrel 26 may comprise an axial length that is suited for a desired length of the component walls 36. The mandrel 26 also desirably comprises the textured surface 28 that is adapted to form the desired surface texture pattern 34 of the internal surface 20 of a component 22. For example, the mandrel 26 may comprise a textured surface 28 having a mandrel surface pattern 58 that is a reverse or mirror image of the surface texture pattern 34 that is desired for the chamber component 22. The surface texture pattern 34 formed on the surface 20 of component 22 is a result of the applied pressure during the flow-forming process which presses the preform material against the mandrel surface 28 such that the internal surface of component 22 substantially assumes the contour of the mandrel surface 28. For example, for a mandrel surface 28 comprising raised protrusions 60a and depressions 60b, the preform material may be pressed and flowed into the depressions 60b in the mandrel surface 28 to form corresponding reverse image features 30 comprising protrusions 30b on the surface of component 22, as shown for example in FIG. 2. The preform material is also flowed about the protrusions 60a on the mandrel surface 28 to form corresponding reverse image features 30 comprising depressions 30a in the component surface 20. The features 60 provided on the mandrel surface 28 can be selected according to the desired surface texture pattern 34, and may comprise for example protrusions 60a and depressions 60b comprising at least one of bumps, holes, ridges, grooves, and other features that may be desirable for the component surface 20. In one version, the mandrel 26 even comprises protrusions 60a and depressions 60b having sizes and spacings in one region of the mandrel surface 28 that differ from the sizes and spacings of the protrusions 60a and depressions 60b in a separate region of the mandrel 28. Flow-forming the component 22 on the mandrel 26 allows for the formation of a surface 20 of component 22 having predetermined dimensions and bulk shape, and simultaneously forming a desired surface texture pattern 34 on the surface of component 22, thus providing an efficient and improved means of fabricating the chamber components 22.

Figure 3:
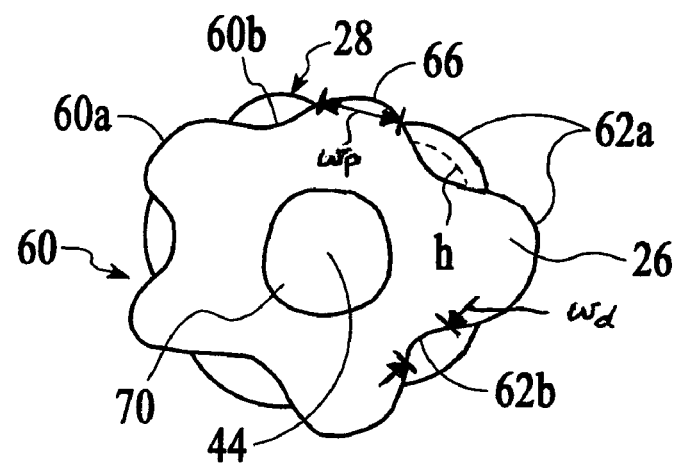
FIG. 3 is a partial sectional front view of an embodiment of a mandrel for a flow-forming process having a textured surface.

In one version, an improved surface texture pattern 34 is provided by flow-forming a component 22 on a mandrel 26 comprising alternating protuberances 62a and depressions 62b, as shown for example in FIG. 3. The alternating protuberances 62a and depressions 62b form a reverse image surface texture pattern 34 in the surface 20 of component 22 comprising corresponding protuberances 64a and depressions 64b, that allows process residues generated in the processing of substrates 104 to adhere to the textured surface 20 of component 22 to reduce the contamination of substrates 104 by the residues. The protuberances 62a in the mandrel surface 28 can comprise, for example, mounds or bumps having a height as measured from an average surface height h of the mandrel surface 28 of at least about 0.005 to about 0.050 inches. The protuberances 62a may have a width $w_p$ at half their height of from about 0.007 to about 0.070 inches. The depressions 62b in the mandrel surface 28 may comprise a depth below the average surface height h of at least about 0.005 to about 0.050 inches, and may comprise a width $w_d$ at half their depth of from about 0.002 to about 0.130 inches. The protuberances 64b and depressions 64a formed in the flow-formed surface 20 of component 22 may have dimensions that substantially correspond to those of the mandrel protuberances 62a and depressions 62b, as shown for example in FIG. 2.

In one version, the textured surface 28 comprises a surface cross-section that is substantially sinusoidal, as shown for example in FIG. 3, which is substantially absent sharp corners and edges. The sinusoidal cross-section comprises a cross-section profile that is substantially similar to that of a sine wave, with the wavelengths and amplitudes of the sinusoidal cross-section being selected according to the desired component characteristics. The sinusoidal cross section provides a smoothly varying surface with alternating protuberances 62a and depressions 62b that provide improved adhesion of process residues, and reduces the cracking or fracturing of deposited residues that can otherwise occur with sharp or abrupt surface transitions. A suitable sinusoidal surface cross section may have a peak-to-peak distance between adjacent protuberances 62a of from about 0.015 to about 0.180 inches and an amplitude of from about 0.005 to about 0.050 inches. In one version, the mandrel surface 28 comprises a first sinusoidal cross-section that circumferentially wraps at least partially around an axis 44 of the mandrel 26, as shown in FIG. 3, and a second sinusoidal cross-section that extends longitudinally along the axis 44 of the mandrel 26, as shown in FIG. 1. The textured surface 28 is desirably substantially absent corners 66 that are sharp and sharp edges, and instead comprises substantially rounded corners 66 and edges.

The mandrel 26 may also be specifically devised for the formation of complex and substantially non-linear surface texture patterns 34 that provide improved results in the processing of substrates 104. Such complex surface patterns can render it difficult to remove of the flow-formed component 22 from the mandrel 26 after the flow-forming process. For example, for surface patterns 34 that do not allow for sliding or twisting of the component 22 from the mandrel 26, the release of the component 22 from the mandrel 26 can be challenging. Such a surface pattern 34 that does not lend itself readily to twisting or sliding of the component 22 from the mandrel 26 is a surface pattern 34 comprising alternating protuberances 64b and depressions 64a, as the mandrel and component protuberances 62a,64b become locked into the mandrel and component depressions 62b,64a. In general, surface patterns 34 that do not comprise linear or spiraling depressions 30a that extend to at least one end 40 of the component 22 can be challenging to remove from the mandrel 26. In one version, the mandrel 26 is adapted for the fabrication of such complex surface patterns by being at least partially collapsible, such that the component 22 can be readily removed from the mandrel 26 after the flow-forming process. For example, the mandrel 26 may comprise a hollow interior section 70 into which sections of the mandrel 26 can collapse following the flow forming process, to provide a smaller circumference of the mandrel and improve the ease of removal of the component 22 from the mandrel 26. For example, the mandrel 26 may be hinged or otherwise constructed in such a way that the mandrel may fold in on itself. In yet another version, the protrusions 60a on the surface 28 of the mandrel 26, such as sinusoidal cross-section protuberances 62a, may be adapted to be withdrawn into the interior section 70 of the mandrel after flow-forming to "unlock" the component 22 from the mandrel surface 28. Thus, the improved mandrel 26 allows for the formation of complex surface patterns 34 on the component 22 that may be substantially absent linear or spiraling depressions that extend along a length of the internal surface 20 of component 22, and is not limited to substantially linear or spiraling surface patterns.

In another version, the flow-formed component 22 is removed from the mandrel 26 by heating the component with an appropriate heat source. The component 22 expands enough so that its internal surface 20 clears the height of the protuberances 64b and depressions 64a on the mandrel 26 to become disengaged thus allowing the component 22 to be removed from the mandrel 26. The amount of heat needed depends on the depth of the protuberances 64b and depressions 64a on the mandrel 26 and the thermal expansion coefficient of the component material.

Figure 4:
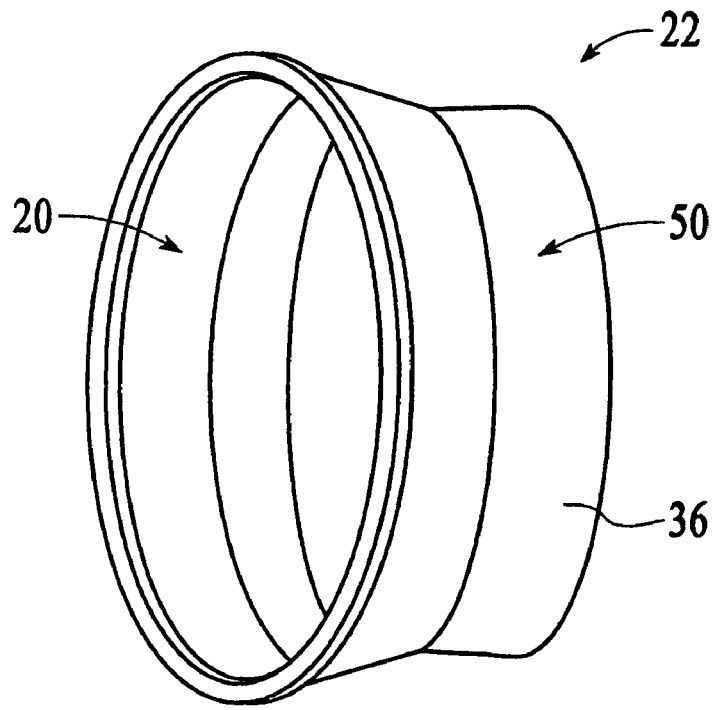
FIG. 4 is a partial side view of an embodiment of a shield formed by a flow-forming process.

An example of a component 22 fabricated by a flow-forming process is shown in FIG. 4. The component 22 comprises a shield 120 suitable for example for a deposition chamber 106. The component 22 is formed from a preform 24 comprising cylindrical sidewalls 36 that are pressed in the flow-forming process into the desired shield wall length and thickness. The internal surface 20 of the component 22 comprising the shield 120 comprises the desired surface textured pattern 34 (not shown) to which process residues can adhere to reduce the contamination of processed substrates 104. Thus, the flow-forming method is capable of providing the component 22 having the desired bulk shape and surface texture in a single process step, thus providing a more efficient and reproducible means of forming the component 22.

Figure 5:
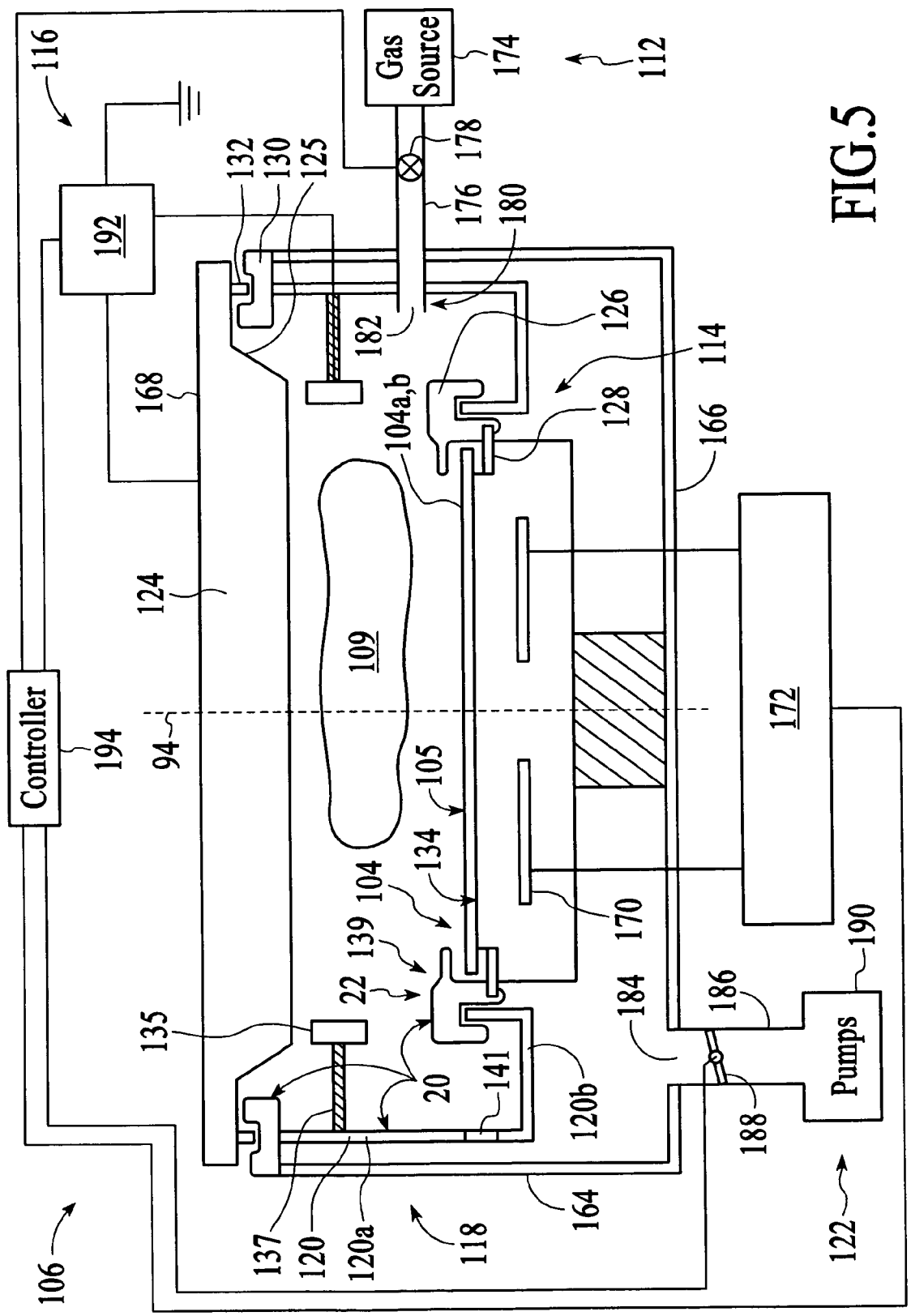
FIG. 5 is a partial sectional side view of an embodiment of a process chamber having one or more flow-formed components.

Different versions of components 22 having the textured surface 20 formed by the flow-forming method are used in a substrate-processing chamber 106, an exemplary embodiment of which is shown in FIG. 5. The chamber 106 is part of a multi-chamber platform (not shown) having a cluster of interconnected chambers connected by a robot arm mechanism that transfers substrates 104a between the chambers 106. In the version shown, the process chamber 106 comprises a sputter deposition chamber, also called a physical vapor deposition or PVD chamber, which is capable of sputter depositing material on a substrate 104a, such as one or more of tantalum, tantalum nitride, titanium, titanium nitride, copper, tungsten, tungsten nitride and aluminum. The chamber 106 comprises enclosure walls 118 that enclose a process zone 109 and that include sidewalls 164, a bottom wall 166 and a ceiling 168. A support ring 130 can be arranged between the sidewalls 164 and ceiling 168 to support the ceiling 168. Other chamber walls can include one or more shields 120 that shield the enclosure walls 118 from the sputtering environment.

The chamber 106 comprises a substrate support 114 to support the substrate in the sputter deposition chamber 106. The substrate support 114 may be electrically floating or may comprise an electrode 170 that is biased by a power supply 172, such as an RF power supply. The substrate support 114 can also support other wafers 104 such as a moveable shutter disk 104b that can protect the upper surface 134 of the support 114 when the substrate 104a is not present. In operation, the substrate 104a is introduced into the chamber 106 through a substrate loading inlet (not shown) in a sidewall 164 of the chamber 106 and placed on the support 114. The support 114 can be lifted or lowered by support lift bellows and a lift finger assembly (not shown) can be used to lift and lower the substrate onto the support 114 during transport of the substrate 104a into and out of the chamber 106.

The support 114 may also comprise one or more rings, such as a cover ring 126 or deposition ring 128, which cover at least a portion of the upper surface 134 of the support 114 to inhibit erosion of the support 114. In one version, the deposition ring 128 at least partially surrounds the substrate 104a to protect portions of the support 114 not covered by the substrate 104a. The cover ring 126 encircles and covers at least a portion of the deposition ring 128, and reduces the deposition of particles onto both the deposition ring 128 and the underlying support 114.

A process gas, such as a sputtering gas, is introduced into the chamber 106 through a gas delivery system 112 that includes a process gas supply comprising one or more gas sources 174 that each feed a conduit 176 having a gas flow control valve 178, such as a mass flow controller, to pass a set flow rate of the gas therethrough. The conduits 176 can feed the gases to a mixing manifold (not shown) in which the gases are mixed to from a desired process gas composition. The mixing manifold feeds a gas distributor 180 having one or more gas outlets 182 in the chamber 106. The process gas may comprise a non-reactive gas, such as argon or xenon, which is capable of energetically impinging upon and sputtering material from a target. The process gas may also comprise a reactive gas, such as one or more of an oxygen-containing gas and a nitrogen-containing gas, that are capable of reacting with the sputtered material to form a layer on the substrate 104a. Spent process gas and byproducts are exhausted from the chamber 106 through an exhaust 122 which includes one or more exhaust ports 184 that receive spent process gas and pass the spent gas to an exhaust conduit 186 in which there is a throttle valve 188 to control the pressure of the gas in the chamber 106. The exhaust conduit 186 feeds one or more exhaust pumps 190. Typically, the pressure of the sputtering gas in the chamber 106 is set to sub-atmospheric levels.

The sputtering chamber 106 further comprises a sputtering target 124 facing a surface 105 of the substrate 104a, and comprising material to be sputtered onto the substrate 104a, such as for example at least one of tantalum and tantalum nitride. The target 124 can be electrically isolated from the chamber 106 by an annular insulator ring 132, and is connected to a power supply 192. The target 124 may comprise a target backing plate having a target rim 125 that is exposed in the chamber 106. The sputtering chamber 106 also has a shield 120 to protect a wall 118 of the chamber 106 from sputtered material. The shield 120 can comprise a wall-like cylindrical shape having upper and lower shield sections 120a, 120b that shield the upper and lower regions of the chamber 106. In the version shown in FIG. 4, the shield 120 has an upper section 120a mounted to the support ring 130 and a lower section 120b that is fitted to the cover ring 126. A clamp shield 141 comprising a clamping ring can also be provided to clamp the upper and lower shield sections 120a,b together. Alternative shield configurations, such as inner and outer shields, can also be provided. In one version, one or more of the power supply 192, target 124 and shield 120, operate as a gas energizer 116 that is capable of energizing the sputtering gas to sputter material from the target 124. The power supply 192 applies a bias voltage to the target 124 with respect to the shield 120. The electric field generated in the chamber 106 from the applied voltage energizes the sputtering gas to form a plasma that energetically impinges upon and bombards the target 124 to sputter material off the target 124 and onto the substrate 104a. The support 114 having the electrode 170 and support electrode power supply 172 may also operate as part of the gas energizer 116 by energizing and accelerating ionized material sputtered from the target 124 towards the substrate 104a. Furthermore, a gas energizing coil 135 can be provided that is powered by a power supply 192 and that is positioned within the chamber 106 to provide enhanced energized gas characteristics, such as improved energized gas density. The gas energizing coil 135 can be supported by a coil support 137 that is attached to a shield 120 or other wall in the chamber 106.

The chamber 106 is controlled by a controller 194 that comprises program code having instruction sets to operate components of the chamber 106 to process substrates 104a in the chamber 106. For example, the controller 194 can comprise a substrate positioning instruction set to operate one or more of the substrate support 114 and substrate transport to position a substrate 104a in the chamber 106; a gas flow control instruction set to operate the flow control valves 178 to set a flow of sputtering gas to the chamber 106; a gas pressure control instruction set to operate the exhaust throttle valve 188 to maintain a pressure in the chamber 106; a gas energizer control instruction set to operate the gas energizer 116 to set a gas energizing power level; a temperature control instruction set to control temperatures in the chamber 106; and a process monitoring instruction set to monitor the process in the chamber 106.

The chamber components 22 having the textured surface 20 can comprise, for example, different arts of the gas delivery system 112, substrate support 114, process kit 139, gas energizer 116, chamber enclosure walls 118 and shields 120, or gas exhaust 122 of the chamber 106. For example, the chamber components 22 having the textured surface 20 can include a chamber enclosure wall 118, a chamber shield 120, a target 124, a target rim 125, a component of a process kit 139 such as at least one of a cover ring 126 and a deposition ring 128, a support ring 130, insulator ring 132, a coil 135, coil support 137, shutter disk 104b, clamp shield 141, and a portion of the substrate support 114. For example, components having the textured surface can include Applied Material's part numbers 0020-50007, 0020-50008, 0020-50010, 0020-

50012, 0020-50013, 0020-48908, 0021-23852, 0020-48998, 0020-52149, 0020-51483, 0020-49977, 0020-52151, 0020-48999, 0020-48042 and 0190-14818, from Applied Materials, Santa Clara, Calif. This list of components is merely exemplary and the other components or components from other types of chambers can also have the textured surface; thus, the present invention should not be limited to the components listed or described herein.

The present invention has been described with reference to certain preferred versions thereof; however, other versions are possible. For example, the flow-formed components can be used in other types of applications, as would be apparent to one of ordinary skill, for example, as components of etching chambers. Other configurations of the flow forming apparatus can also be used, and mandrel surface patterns other than those specifically described can also be provided. Further, alternative steps equivalent to those described for the flow-forming method can also be used in accordance with the parameters of the described implementation, as would be apparent to one of ordinary skill. Therefore, the spirit and scope of the appended claims should not be limited to the description of the preferred versions contained herein.

What is claimed is:

1. A method of fabricating a shield for a substrate processing chamber, the method comprising:
    (a) providing a preform having a cylindrical sidewall with internal and external surfaces;
    (b) providing a mandrel with a textured surface having a pattern of textured features comprising periodic and alternating protrusions and depressions;
    (c) contacting the internal surface of the cylindrical sidewall of the preform with the textured surface of mandrel; and
    (d) applying a pressure to the preform that is sufficiently high to plastically deform the cylindrical sidewall of the preform and cause the internal surface of the cylindrical sidewall to flow over the textured surface of the mandrel to form a shield for a substrate processing chamber, the shield having a textured internal surface comprising a pattern of textured features.

2. A method according to claim 1 wherein (d) comprises forming a shield having a textured internal surface that is substantially absent linear or spiraling depressions that extend along a length of the textured internal surface.

3. A method according to claim 1 wherein (b) comprises providing a mandrel having protrusions and depressions that comprise at least one of bumps, holes, ridges, and grooves.

4. A method according to claim 3 wherein the protrusions have a height of from about 0.005 to about 0.050 inches, and a width at half height of from about 0.007 to about 0.070 inches.

5. A method according to claim 4 wherein the depressions have a depth of from about 0.005 to about 0.050 inches, and a width at half depth of from about 0.002 to about 0.130 inches.

6. A method according to claim 1 wherein the pattern of textured features comprises a sinusoidal cross-section.

7. A method according to claim 1 wherein (b) comprises providing a mandrel having a textured surface comprising textured features that are substantially absent sharp corners and sharp edges.

8. A method according to claim 1 wherein (b) comprises providing a mandrel that is at least partially collapsible.

9. A method according to claim 1 wherein in (d) the shield is removed from the mandrel by heating the shield and causing the internal surface of the shield to expand above the height of the protrusions of the mandrel thus allowing removal from the mandrel.

10. A method according to claim 1 wherein (d) comprises applying a pressure on the preform by pressing rotating rollers against the external surface of the preform.

11. A method according to claim 1 wherein the preform comprises at least one of aluminum, copper, stainless steel, titanium, and associated alloys.

12. A method of fabricating a component for a substrate processing chamber, the method comprising:
    (a) providing a preform having a cylindrical sidewall with internal and external surfaces;
    (b) providing a mandrel having a textured surface, the textured surface having a pattern of periodic and alternating protuberances and depressions, wherein the protuberances have a height of from about 0.005 to about 0.050 inches and a width at half height of from about 0.007 to about 0.070 inches, and the depressions have a depth of from about 0.005 to about 0.050 inches, and a width at half depth of from about 0.002 to about 0.130 inches;
    (c) contacting the internal surface of the cylindrical sidewall of the preform with the textured surface of a mandrel; and
    (d) pressing rotating rollers against the external surface of the preform to plastically deform the preform causing the internal surface of the preform to flow over the textured surface of the mandrel, thereby forming a shield for a substrate processing chamber, the shield having a textured internal surface comprising a reverse pattern of alternating protuberances and depressions that is a mirror image of the pattern on the mandrel.

13. A method according to claim 12 wherein the preform comprises at least one of aluminum, copper, stainless steel, titanium, and associated alloys.

14. A method according to claim 12 wherein (a) comprises providing a preform having a conical, cylindrical, or tube-like shape.

15. A method according to claim 12 wherein (b) comprises providing a mandrel having a pattern of textured features comprising a sinusoidal cross-section.

16. A method according to claim 12 wherein the sinusoidal cross-section comprises a peak-to-peak distance between adjacent protuberances of from about 0.015 to about 0.180 inches and an amplitude of from about 0.005 to about 0.050 inches.

17. A method according to claim 12 wherein (b) comprises providing a mandrel that is at least partially collapsible.

18. A method according to claim 12 wherein (c) comprises aligning an axis of circular symmetry of the perform to an axis of symmetry of the mandrel.

19. A method according to claim 12 wherein (d) comprises pressing rotating rollers that are spaced apart about the circumference of the preform.

20. A method according to claim 12 wherein (d) comprises rotating the mandrel.

21. A method according to claim 12 wherein in (d) the component is removed from the mandrel by heating the component and causing the internal surface of the component to expand above the height of the protuberances of the mandrel thus allowing removal from the mandrel.

* * * * *